United States Patent [19]

Ohashi et al.

[11] Patent Number: 5,078,312
[45] Date of Patent: Jan. 7, 1992

[54] WIRE BONDING METHOD

[75] Inventors: Yuji Ohashi; Nobuto Yamazaki, both of Tokyo, Japan

[73] Assignee: Kabushiki Kaisha Shinkawa, Tokyo, Japan

[21] Appl. No.: 488,697

[22] Filed: Mar. 5, 1990

[30] Foreign Application Priority Data

Mar. 6, 1989 [JP] Japan ................................. 1-51973

[51] Int. Cl.⁵ ..................... B23K 20/10; H01L 21/607
[52] U.S. Cl. ...................... 228/102; 228/1.1; 228/179
[58] Field of Search ................ 228/1.1, 102, 110, 179

[56] References Cited

U.S. PATENT DOCUMENTS 4,266,710  5/1981  Bilane et al. ................. 228/1.1 X
4,789,095  12/1988  Kobayashi ...................... 228/102

Primary Examiner—Kenneth J. Ramsey
Attorney, Agent, or Firm—Koda and Androlia

[57] ABSTRACT

A wire bonding method wherein a bonding tool is lowered in a pre-loaded state, and bonding is performed under a bonding load which is smaller than the pre-loading load. The pre-loading load is changed to the bonding load before the bonding tool contacts a bonding point, and the bonding tool contacts the bonding point under such bonding load, thus performing bonding. Such bonding is performed also by changing the pre-loading load into a load which is smaller than the bonding load before the bonding tool contracts a bonding point and further changing such load into the bonding load after the bonding tool has contacted the bonding point.

2 Claims, 2 Drawing Sheets

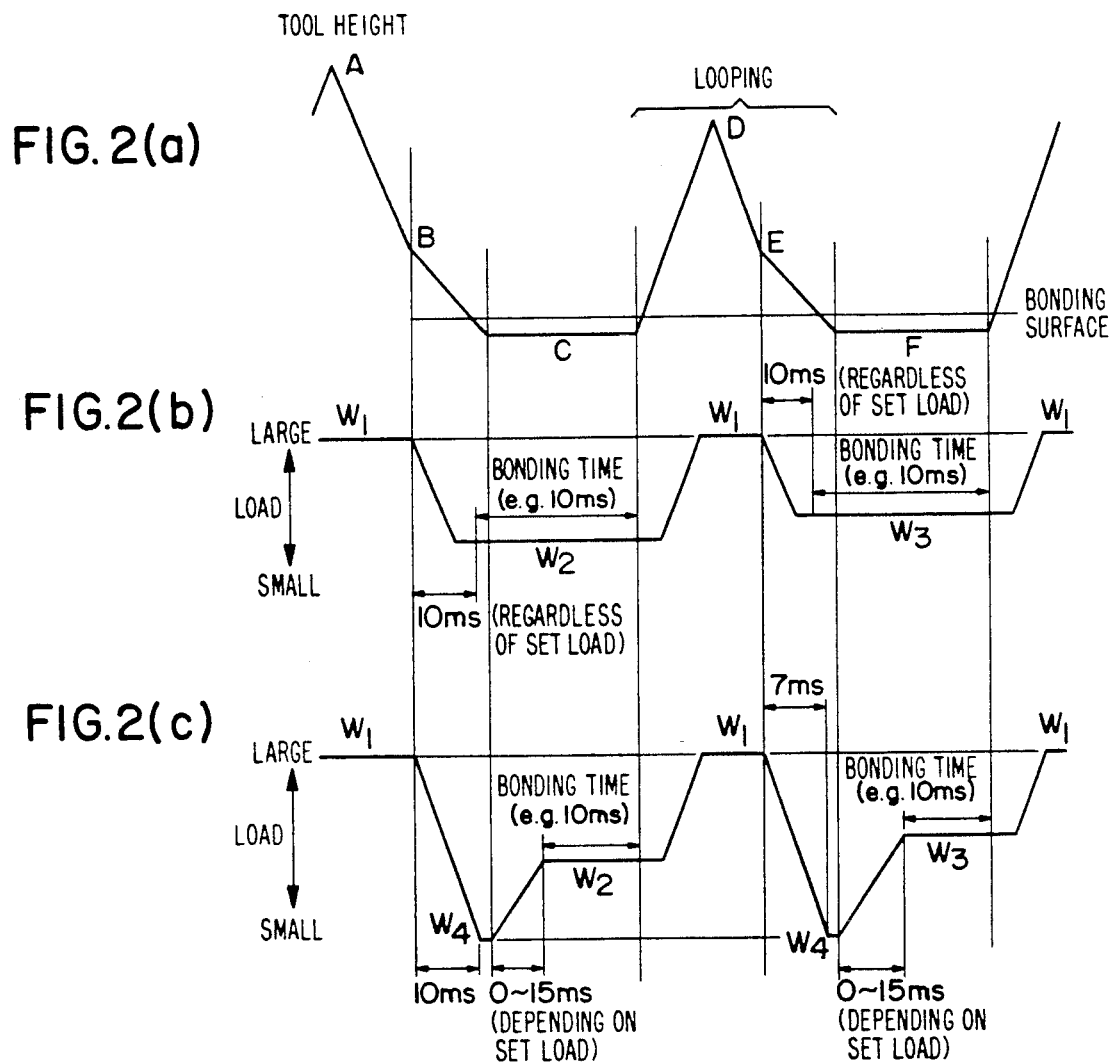

WIRE BONDING METHOD

BACKGROUND OF THE INVENTION

1. Field of the Invention

The present invention relates to a wire bonding method for the manufacture of semiconductor devices, etc.

2. Prior Art

In wire bonding methods, as is well known, bonding is performed by pressing a wire (passed through a tool) onto a bonding point.

Conventionally, the bonding load which presses the tool against the bonding point has been viewed as a load which can be set arbitrarily (for example, such loads are described in Japanese Patent Application Laid-Open No. 53-45970 and Japanese Patent Application Publication No. 63-50856).

Such wire bonding mechanisms have a load-supplying means which includes a solenoid coil and an iron core which is positioned inside the solenoid coil. During lowering and raising of the tool, a load which is larger than the bonding load (hereinafter called "pre-loading load") is applied so that a transducer which holds the tool at one end follows a cam which drives the transducer.

In a bonding method which uses such a bonding device, the tool is lowered in a pre-loaded state, and the load is changed to the bonding load (which is smaller than the preloading load) after the tool has contacted the bonding point. An ultrasonic oscillating output is output, and bonding is performed with the wire pressed against the sample under the bonding load.

In the above-described prior art, the tool contacts the bonding point under the pre-loading load (large load). The impact load which is generated at the time of this contact accompanies the lowering action of the tool and is therefore larger than the pre-loading load. When this large impact load is applied to the sample, damage such as cracks, cratering, etc. may result. Furthermore, if the impact load which is applied when the tool contacts the bonding point is large, the transducer holding the tool will vibrate. As a result, a uniform load cannot be applied to the bonding point from the tip of the tool. Accordingly, the aforementioned ultrasonic oscillating output is applied in a state of fluctuating load, which has a deleterious effect on bondability.

SUMMARY OF THE INVENTION

The object of the present invention, therefore, is to provide a wire bonding method in which the impact occurring at the time that the tool contacts the bonding point is reduced so that bonding can be performed by applying an ultrasonic oscillating output under a stable bonding load, thus improving bondability.

The object of the present invention is achieved as follows: in a wire bonding method in which (a) a bonding tool is lowered in a pre-loaded state, and (b) bonding to the bonding point is performed under a bonding load which is smaller than the pre-loading load, (1) the load is changed to the bonding load before the tool contacts the bonding point, (2) the tool is caused to contact the bonding point under this bonding load, and (3) then, boding is performed.

Alternatively, the object of the present invention may be achieved by (1) changing the load to a load which is smaller than the bonding load before the tool contacts the bonding point, (2) changing the load to the bonding load after the tool has contacted the bonding point, and (3) then performing bonding.

With such methods, when the tool contacts the bonding point, the tool is subjected to a load which is equal to or smaller than the bonding load; accordingly, the impact load is extremely small. As a result, damage (cracks and cratering, etc.) to the sample is prevented. Furthermore, the occurrence of vibration in the transducer is also prevented, so that bonding can be performed by applying an ultrasonic oscillating output under a stable bonding load, thus improving bondability.

BRIEF DESCRIPTION OF THE DRAWINGS

FIGS. 2(a), (b) and (c) illustrate the wire bonding method of the present invention wherein FIG. 2(a) is a diagram showing the movement track of the tool, FIG. 2(b) is a load setting diagram illustrating one embodiment of the present invention, and FIG. 2(c) is a load setting diagram which illustrates another embodiment of the present invention.

DETAILED DESCRIPTION OF THE INVENTION

Figure 1A:
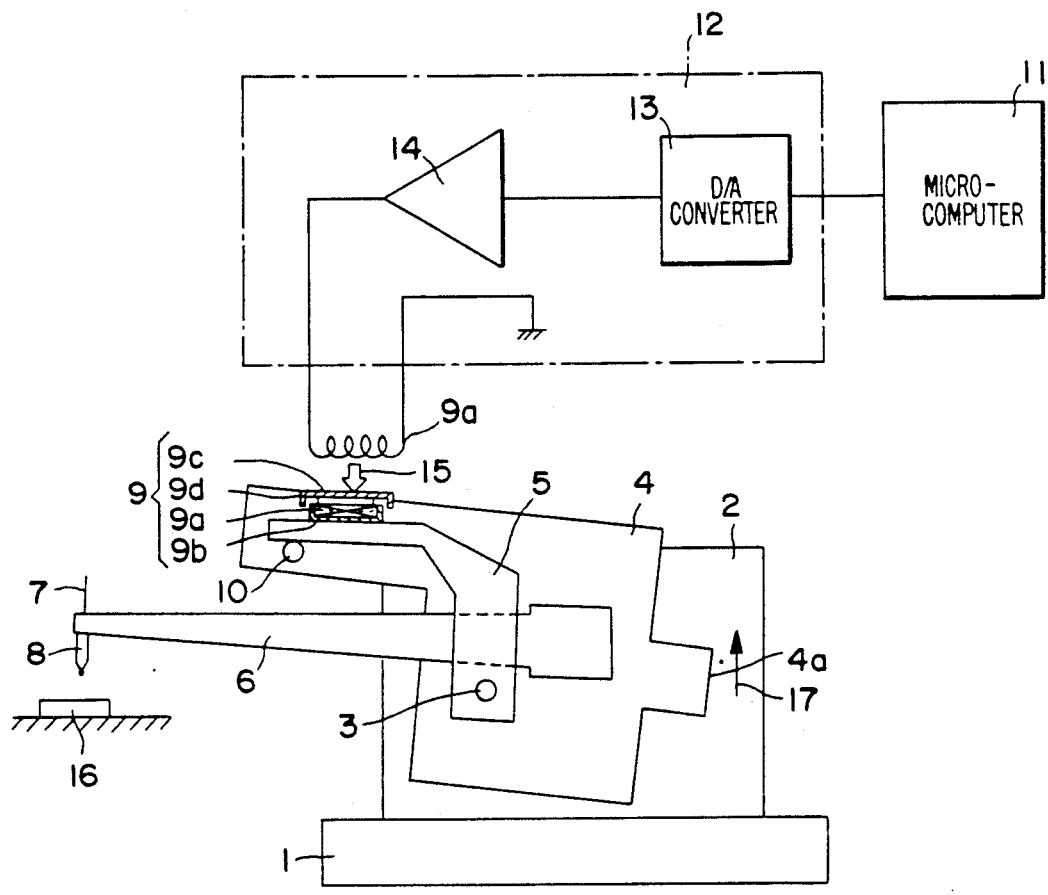
FIG. 1(a) and FIG. 1(b), respectively, is an explanatory diagram of one example of a wire bonding apparatus which is used in the wire bonding method of the present invention.

One embodiment of the present invention will be described with reference the accompanying drawings.

As is shown in FIG. 1, a bonding head 2 is mounted on an X-Y table 1 which is driven in the X and Y directions, and a pivot shaft 3 is supported so that it is free to rotate on the bonding head 2. A vertically moving block 4 is fastened to the pivot shaft 3, and an arm 5 is mounted so that the arm 5 is free to rotate. The power point 4a of the vertically moving block 4 is driven up and down by a vertical driving means (not shown). A transducer 6 is fastened to the arm 5, and a tool 8 through which a wire 7 is passed is fastened to the tip of the transducer 6.

One side of a linear motor 9 is attached to the arm 5, and other side of the linear motor 9 is attached to the vertically moving block 4. In this embodiment, a coil frame 9b which has a solenoid coil 9a is attached to the arm 5, and an iron core frame 9d which has an iron core 9c is fastened to the vertically moving block 4. Furthermore, a stopper 10 is attached to the vertically moving block 4 so that the stopper 10 faces the lower surface of the arm 5.

A control output is sent to the solenoid coil 9a of the linear motor 9 from a microcomputer 11 via linear motor control circuit 12. In the Figures, reference numeral 13 is a D/A converter, and 14 is an output amplifier.

Next, the operation of the embodiment will be described below:

An electric current is caused to flow through the solenoid coil 9a by the linear motor control circuit 12 in accordance with a control signal from the microcomputer 11. The iron core 9c is actuated according to the magnitude of this electric current so that a force (load) is applied to the arm 5 in the direction indicated by arrow 15. In this case, in a state in which the tool 8 is not in contact with the sample 16 (such a state is indicated in FIG. 1(a)), the arm 5 is pressed against the stopper 10 by the force acting in the direction indicated by the arrow 15.

When the power point 4a of the vertically moving block 4 is raised in the direction indicated by arrow 16 (via the vertical driving means which is not shown), the vertically moving block 4 rotates in a counterclockwise direction about the pivot shaft 3. In this case, since the arm 5 is pressed against the stopper 10 by the force acting in the direction of the arrow 15 (as was described above), the arm 5 and transducer 6 both rotate together when the vertically moving block 4 rotates in a counter-clockwise direction about the pivot shaft 3 as described above.

Figure 1B:
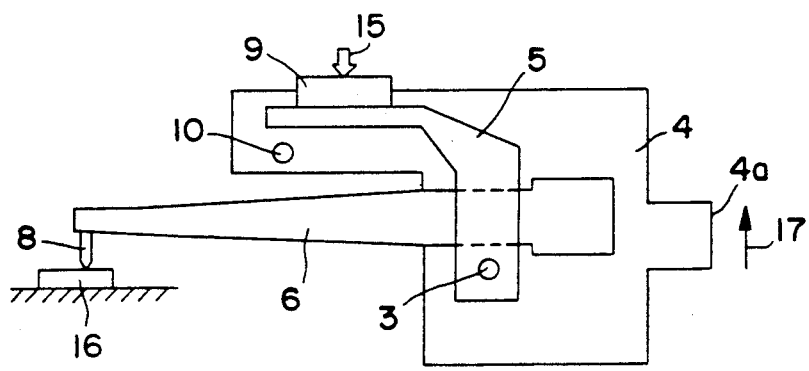

Then, the tool 8 contacts the sample 16. When the power point 4a of the vertically moving block is further raised from this position, the stopper 10 is removed from the arm 5 as shown in FIG. 1(b). In this state, the force applied to the arm 5 in the direction of arrow 15 applies a bonding load to the transducer 6, i.e., to the tool 8. Accordingly, the load can be freely set by varying the magnitude of the electric current applied to the linear motor 9.

Next, a method (embodying the present invention) in which wire bonding is performed using such a wire bonding apparatus will be described with reference to FIG. 2(a) and FIG. 2(b).

The tool 8 is driven upward and downward according to the track indicated in FIG. 2(a). While the tool 8 is driven upward and downward, a control output is applied to the linear motor 9 in accordance with the timing shown in FIG. 2(b), so that a load is applied to the tool 8.

The tool 8 is lowered at a high speed from point A above the first bonding point C to search level point B which is located approximately 150 to 200 microns above the first bonding point C. From point A to point B, an electric current is supplied to the solenoid coil 9a so that a large pre-loading load ($W_1 = 180$ g) is applied to the stopper 10.

The tool 8 is then lowered at a slow speed from the search level point B toward the first bonding point C. Furthermore, at the same time, the electric current flowing through the solenoid coil 9 at search level point B is changed, so that the load is changed linearly within 10 msec to bonding load $W_2$ which is appropriate for the first bonding point C (e.g., 40 g). Under this bonding load $W_2$, the tool 8 contacts the first bonding point C. If the amount of sink is set, the tool 8 sinks by such amount; afterward, ultrasonic oscillation is performed for a given period of time set by a timer, so that the wire 7 is bonded to the first bonding point C under the bonding load $W_2$.

After bonding to the first bonding point C has been completed, the tool 8 is raised, lowered and moved toward the second bonding point F, i.e., is moved to search level point E via point D, so that wire looping is performed. While the tool 8 is thus being raised from the first bonding point C to point D, an electric current is supplied to the solenoid coil 9a so that the load applied is the pre-loading load ($W_1 = 180$ g). In regard to this pre-loading load $W_1$, the load is changed to 180 g in approximately 2 msec at a position approximately halfway in height between C and D.

The lowering of the tool 8 from point D to search level point E and then to the second bonding point F, the setting of the load and the wire bonding operation (wire bonding to the second bonding point F) are performed in the same manner as in the case of the points A, B and C. It goes without saying that at search level point E, the load is changed to a bonding load $W_3$ (e.g., 60 g) which is appropriate for the second bonding point F.

Thus, while the tool 8 is in contact with bonding points C and F, the respective bonding loads are $W_2$ and $W_3$, so that the impact load in each case is extremely small. As a result, damage to the sample (such as cracking or cratering, etc.) is prevented. Furthermore, the occurrence of vibration in the transducer 6 is also prevented. Thus, bonding can be performed by applying an ultrasonic oscillating output under a stable bonding load, so that bondability is improved.

FIG. 2 (c) illustrates another embodiment of the present invention. In this embodiment, the pre-loading load $W_1$ (e.g., 180 g) applied during the interval between point A and search level point B (shown in FIG. 2(a)) is the same as in the case of FIG. 2(b); however, at search level point B, the load is changed linearly over a period of approximately 10 msec to a load $W_4$ (e.g., 20 g) which is even smaller than the bonding load $W_2$ (e.g., 40 g) used at the first bonding point C. The tool 8 contacts the first bonding point C under this load $W_4$ (= 20 g).

If the amount of sink is set, the load is linearly changed from the load $W_4$ to the bonding load $W_2$ while the tool 8 sinks by such amount; ultrasonic oscillation is then performed for a given period of time set by a timer, so that the wired 7 is bonded to the first bonding point C under the bonding load $W_2$.

After bonding to the first bonding point C has been completed, the tool 8 is moved via point D to search level point E as in the embodiment described above, so that wire looping is performed. Furthermore, while the tool 8 is being raised from the first bonding point C to point D, an electric current is supplied to the solenoid coil 9a so that the load applied is the pre-loading load $W_1$ (= 180 g).

The lowering of the tool 8 from point D to search level point E and then to the second bonding point F, the setting of the load and the wire bonding operation (wire bonding to the second bonding point F) are performed in the same manner as in the case of the points A, B and C. It also goes without saying that at search level point E, the load is changed to a bonding load $W_3$ (e.g., 60 g) which is appropriate for the second bonding point F.

In this embodiment, while the tool 8 is in contact with bonding points C and F, the load applied in each case is even smaller than the bonding load $W_2$ or $W_3$. Accordingly, the effect obtained is even more superior than the effect obtained in the first embodiment.

In the present invention, as is clear from the above description, the load applied when the tool contacts the bonding point is equal to or less than the bonding load, so that the impact load is extremely small. As a result, damage to the sample is prevented. Furthermore, since the occurrence of vibration in the transducer is also prevented, bonding can be performed by applying an ultrasonic oscillating output under a stable bonding load, so that bondability is improved.

I claim:

1. A wire bonding method comprising:
   lowering a bonding tool towards a bonding point with a pre-load; and
   changing a load on said bonding tool to a bonding load which is smaller than said pre-load and equal to or less than a load required for bonding before said bonding tool contacts said bonding point;
   whereby said bonding tool contacts said bonding point under said bonding load to perform bonding and reduce an impact load.

2. A wire bonding method according to claim 1, wherein a setting of said loads is performed by means of a microcomputer.

* * * * *